United States Patent [19]

Redfern

[11] 4,075,509
[45] Feb. 21, 1978

[54] CMOS COMPARATOR CIRCUIT AND METHOD OF MANUFACTURE

[75] Inventor: Thomas P. Redfern, San Jose, Calif.

[73] Assignee: National Semiconductor Corporation, Santa Clara, Calif.

[21] Appl. No.: 731,269

[22] Filed: Oct. 12, 1976

[51] Int. Cl.$^2$ .................... H03K 17/60; H01L 29/78; H01L 27/08; H03K 17/16

[52] U.S. Cl. .................................. 307/251; 307/240; 307/355; 357/23; 357/41

[58] Field of Search ............... 307/251, 304, 350, 355, 307/352, 353, 240, 241, 242, 243, 200 B; 357/23, 41

[56] References Cited

U.S. PATENT DOCUMENTS

| | | | |
|---|---|---|---|
| 3,641,405 | 2/1972 | Brown et al. .......................... 357/41 |
| 3,652,906 | 3/1972 | Christensen ........................... 357/41 |
| 3,747,200 | 7/1973 | Rutledge ............................ 357/41 X |
| 3,813,586 | 5/1974 | Conner ............................... 357/41 X |
| 3,983,414 | 9/1976 | Stafford et al. ...................... 307/251 |
| 4,004,157 | 1/1977 | Baertsch et al. ..................... 307/353 |

Primary Examiner—Larry N. Anagnos
Attorney, Agent, or Firm—Gail W. Woodward; Willis E. Higgins

[57] ABSTRACT

A chopper stabilized comparator which compares two low level DC signals, and converts these signals to an AC signal which is amplified by AC amplifiers. The AC amplifier output is proportional to the difference between the two DC signals. The circuit has the advantage that it does not have any DC offset terms, for example, it does not drift with temperature.

The comparator is implemented in CMOS technology wherein the actual physical layout of the circuit is chosen such that changes in mask orientation during the fabrication process have no effect upon the proper operation of the circuit.

3 Claims, 3 Drawing Figures

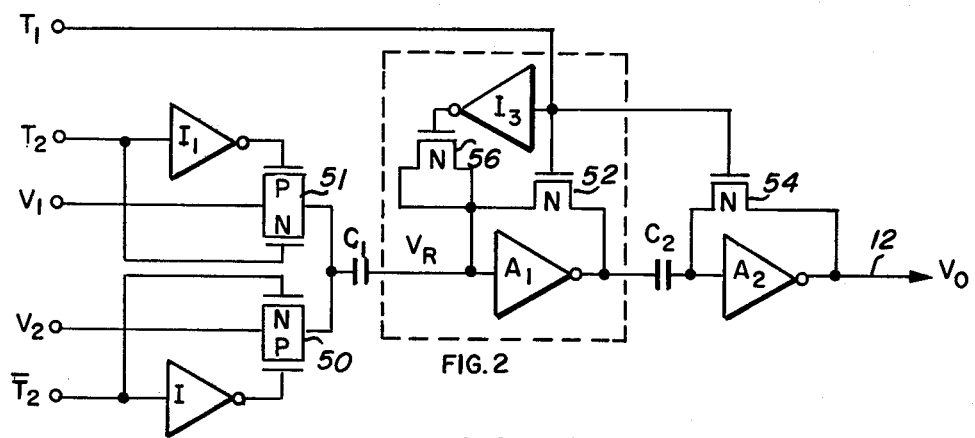
Fig_1
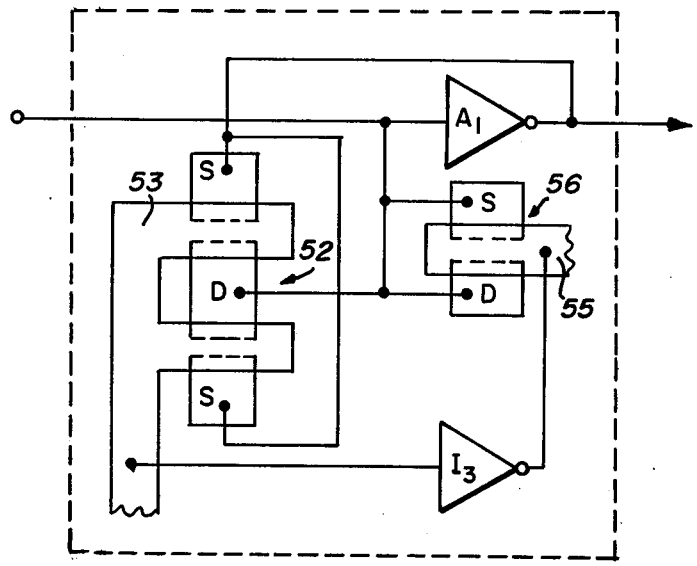
Fig_2
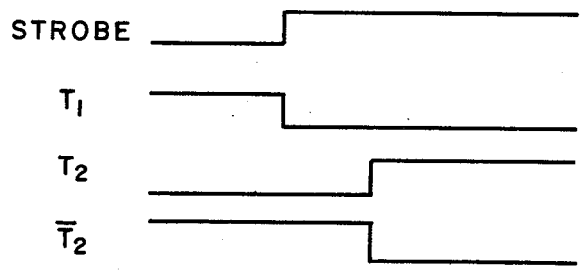
Fig_3

CMOS COMPARATOR CIRCUIT AND METHOD OF MANUFACTURE

BACKGROUND OF THE INVENTION

1. Field of the Invention

The invention relates to comparator circuits and more particularly to a comparator circuit which is implemented in CMOS transistor technology.

2. Description of the Prior Art

In manufacturing a chopper stabilized comparator in CMOS technology, a problem arises in the fabrication of the MOS switches. If there is a mismatch between the internal capacitance of the transistor switches this generates a considerable offset voltage internally within the circuit. What causes the mismatch in the balance of the capacitors is the alignment of the mask used to fabricate the source and drain areas.

It is therefore an object of this invention to provide a novel circuit layout wherein the alignment of the mask during manufacture is not critical.

A further problem of the prior art is that underneath the gate electrodes the drain and the source protrude into the gate area. First, because of alignment and secondly because of lateral diffusion. During the manufacturing process, the lateral diffusion error varies from unit to unit.

It is therefore a further object of the invention to manufacture CMOS switches which are not sensitive to lateral diffusion.

SUMMARY OF THE INVENTION

The above objects are accomplished in accordance with the invention by providing a novel mask geometry for the gate electrode such that the total source/drain area under the gate remains the same regardless of the alignment of the mask within a certain predetermined tolerance. In accordance with a further aspect of the invention, a dummy transistor is utilized in the first stage of amplification to provide for nullifying charge coupling due to transistor gate electrode capacitance.

The invention has the advantage that the circuit is not sensitive to alignment variations.

The invention has the further advantage that the total capacitive coupling between transistors remains fixed.

With respect to lateral diffusion, the circuit has the advantage that since the dummy transistor has both its source and drain tied together, the increase due to lateral diffusion is cancelled.

The invention has the further advantage that because of the geometry the channel capacitance is cancelled.

The foregoing and other objects, features and advantages of the invention will be apparent from the following more particular description of a preferred embodiment of the invention as illustrated in the accompanying drawings.

BRIEF DESCRIPTION OF THE DRAWINGS

FIG. 1 is a schematic diagram of a comparator circuit in which the invention is embodied;

FIG. 2 is a schematic diagram showing the details of the integrated circuit structure of that portion of the circuit of FIG. 1 shown within the dotted lines; and FIG. 3 is a timing diagram illustrating the operation of the circuit of FIG. 1.

DESCRIPTION

Referring to FIG. 1 and the timing diagram of FIG. 3, amplifiers A1 and A2 are CMOS inverters with a gain of K and a ratio of p to n-channel gain such that when the output is shorted to the input the output voltage equals the input voltage within the linear range of operation. A switch 51 is provided coupled to an input voltage V1 and a switch 50 is provided coupled to an input voltage V2. The switches 52 and 54 are energized by T1, while switch 56 is de-energized through inverter $I_3$. The switches 51 and 50 are energized in a complementary manner by timing pulses T2 and $\overline{T2}$, respectively (see FIG. 3). When the switch 50 closes and the switches 52 and 54 close, the switches 52 and 54 bias the amplifiers A1 and A2 to their input voltages (VR) in the linear region of operation. Switch 50 couples the voltage V2 to the capacitor c1. After a period of time allowing for transients to settle, the voltage on the capacitor C1 becomes V2-VR. Switches 50, 52 and 54 open and then switch 51 closes applying the voltage V1 to the capacitor C. Since the input impedance of the CMOS inverter A1 is very large, no current can flow from the V1 input voltage through capacitor C1. The voltage at the input of A1 is then Vin=V1−V2+VR.

Since the original voltage on the input of the CMOS inverter was VR, the change in voltage is equal to (V1 − V2 + VR) − VR or V1 − V2, which is the difference in the positive and negative inputs. The change in voltage on the output of A1 is then −K × (V1 − V2). By cascading the stages A1 and A2, a high gain differential comparator results with zero offset voltage and a high common mode range. The output voltage on line 12 is then equal to VR + (V1 − V2)$K^2$.

Referring now to FIG. 2, the CMOS transistor structure of switches 52 and 56 is shown. In order for this amplifier to function properly, the switches 52 and 56 must be constructed so that they are not sensitive to mask alignment tolerances during the manufacturing process.

Under the gate electrodes the drain and source areas protrude into the gate region both because of alignment of the mask and lateral diffusion during the manufacturing process. Therefore, the switches 52 and 56 must be designed so that they are not sensitive to lateral diffusion. The switching transistor 52 is a double transistor which is twice the size and of the same orientation as a dummy transistor 56. The sources of the transistor 52 are tied together so that it effectively becomes one transistor which is twice the size of the dummy transistor.

The metal lines 53 are oriented such that if the mask used to form the metal shifts upward, the overlap of metal into the source area would be increased whereas the overlap into the lower source area would be decreased. Thus, the total overlap to the node, since the sources are tied together, remains constant. This circuit is not sensitive to misalignment in the vertical direction.

With respect to the transistor 56, since the source and drain are tied together, any vertical misalignment of the metal 55 increases the source area and decreases the drain area in the upward direction, and vice versa in the downward direction. Thus, the total coupling to the node remains fixed.

As far as lateral diffusion is concerned, the diffusion is the same for both transistors since they are both N-channel.

This configuration also cancels the gate-to-channel capacitance if the two transistors 52 and 56. Transistor 52 is twice the size of transistor 56. Half of the gate-to-channel capacitance is attributable to the drain and half to the source. In effect, half of this capacitance of the "double" transistor 52 is equal to the whole capacitance of the "single" transistor 56. Subsequent stages added on after stage A2 result in a minor image effect such that the capacitance from stage to stage cancels.

The invention has been described with reference to N-channel devices, however, those having ordinary skill in the art can adapt the principles of the invention to P-channel devices as well.

While the invention has been particularly shown and described with reference to a preferred embodiment thereof, it will be understood by those skilled in the art that various changes in form and detail may be made therein without departing from the spirit and scope of the invention.

What is claimed is:

1. In a chopper stabilized amplifier including an amplifying section having input and output terminals, switch means coupled between said input and output terminals for periodically coupling said terminals together, and dummy transistor means for suppressing transient switching pulses produced at said input terminal by said switch means, means for combining said dummy transistor with said switch means whereby said transient suppression is rendered insensitive to gate alignment and lateral diffusion errors, said combination comprising:

dummy transistor means having source, gate and drain electrodes;

switch transistor means having a common drain electrode, a pair of source electrodes, and a pair of gate electrodes, each one of said pair of source electrodes having a length equal to the length of said dummy transistor source electrode and a spacing from said common drain electrode equal to the source to drain spacing in said dummy transistor;

means coupling said dummy transistor source and drain electrodes to said common drain electrode of said switch transistor means and means coupling said pair of gate electrodes of said switch transistor means together whereby said switch transistor means has an effective channel width of twice that of said dummy transistor means and said common drain electrode of said switch transistor means along with said source and drain of said dummy transistor means comprise a circuit node; and means for switching said gate of said dummy transistor means in complementary fashion with said pair of gate electrodes of said switch transistor means whereby the switching transients at said circuit node cancel.

2. The structure of claim 1 wherein said pair of source electrodes of said switch transistor means are located on opposite sides of said common drain electrode.

3. The structure of claim 2 wherein said pair of gate electrodes of said switching transistor and said gate electrode of said dummy transistor means are arrayed in a parallel configuration.

* * * * *